(12) United States Patent
Lauer et al.

(10) Patent No.: US 9,324,801 B2
(45) Date of Patent: Apr. 26, 2016

(54) NANOWIRE FET WITH TENSILE CHANNEL STRESSOR

(71) Applicant: International Business Machines Corporation, Armonk, NY (US)

(72) Inventors: Isaac Lauer, Yorktown Heights, NY (US); Chung-Hsun Lin, White Plains, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/511,837

(22) Filed: Oct. 10, 2014

(65) Prior Publication Data

US 2015/0303262 A1 Oct. 22, 2015

Related U.S. Application Data

(63) Continuation of application No. 14/256,225, filed on Apr. 18, 2014.

(51) Int. Cl.
| | |
|---|---|
| *H01L 29/10* | (2006.01) |
| *H01L 29/06* | (2006.01) |
| *H01L 29/66* | (2006.01) |
| *H01L 29/78* | (2006.01) |

(52) U.S. Cl.
CPC ........ *H01L 29/1054* (2013.01); *H01L 29/0669* (2013.01); *H01L 29/66553* (2013.01); *H01L 29/66795* (2013.01); *H01L 29/785* (2013.01); *H01L 29/7842* (2013.01); *H01L 29/06* (2013.01); *H01L 29/66* (2013.01)

(58) Field of Classification Search
CPC ............ H01L 29/1054; H01L 29/0669; H01L 29/785; H01L 29/66795; H01L 29/7842; H01L 29/66553; H01L 29/10; H01L 29/66; H01L 29/06
See application file for complete search history.

(56) References Cited

U.S. PATENT DOCUMENTS

| 8,373,230 B1 | 2/2013 | Or-Bach et al. |
| 2005/0236687 A1* | 10/2005 | Chan ................... H01L 21/2022 257/482 |

(Continued)

OTHER PUBLICATIONS

Office Action dated Dec. 22, 2015 received in the parent U.S. Patent Application, namely U.S. Appl. No. 14/256,225.

*Primary Examiner* — Caleb Henry
*Assistant Examiner* — Alexander Belousov
(74) *Attorney, Agent, or Firm* — Scully, Scott, Murphy & Presser, P.C.; Steven J. Meyers

(57) ABSTRACT

Fin stacks including a silicon germanium alloy portion and a silicon portion are formed on a surface of a substrate. Sacrificial gate structures are then formed straddling each fin stack. Silicon germanium alloy portions that are exposed are oxidized, while silicon germanium alloy portions that are covered by the sacrificial gate structures are not oxidized. A dielectric material having a topmost surface that is coplanar with a topmost surface of each sacrificial gate structure is formed, and thereafter each sacrificial gate structure is removed. Non-oxidized silicon germanium alloy portions are removed suspending silicon portions that were present on each non-oxidized silicon germanium alloy portion. A functional gate structure is then formed around each suspended silicon portion. The oxidized silicon germanium alloy portions remain and provide stress to a channel portion of the suspended silicon portions.

16 Claims, 9 Drawing Sheets

(56) References Cited

U.S. PATENT DOCUMENTS

| | | | |
|---|---|---|---|
| 2009/0008705 A1 | 1/2009 | Zhu et al. | |
| 2010/0207208 A1* | 8/2010 | Bedell | B82Y 10/00 257/346 |
| 2010/0295021 A1* | 11/2010 | Chang | H01L 27/1203 257/24 |
| 2011/0031473 A1* | 2/2011 | Chang | B82Y 10/00 257/24 |
| 2012/0138886 A1* | 6/2012 | Kuhn | B82Y 10/00 257/9 |
| 2012/0319178 A1* | 12/2012 | Chang | B82Y 10/00 257/287 |
| 2013/0334571 A1 | 12/2013 | Reznicek et al. | |
| 2014/0021538 A1 | 1/2014 | Bangsaruntip et al. | |
| 2014/0070277 A1 | 3/2014 | Adam et al. | |

* cited by examiner

NANOWIRE FET WITH TENSILE CHANNEL STRESSOR

BACKGROUND

The present application relates to a non-planar semiconductor device and a method of fabricating the same. More particularly, the present application relates to a semiconductor nanowire field effect transistor (FET) device having a channel that is strained, and a method of forming the same.

The use of non-planar semiconductor devices such as, for example, FinFETs, trigate and gate-all around semiconductor nanowire field effect transistors (FETs) is the next step in the evolution of complementary metal oxide semiconductor (CMOS) devices. The addition of stress elements in non-planar semiconductor devices is of critical importance in avoiding serious performance losses migrating out of planar device architectures. Notably, the ability to strain the channels of semiconductor nanowire field effect transistors is an important process capability to implement for performance device tuning. Thus, techniques are needed to form semiconductor nanowire field effect transistor (FET) devices that have strained channels.

SUMMARY

Fin stacks including a silicon germanium alloy portion and a silicon portion are formed on a surface of a substrate. Sacrificial gate structures are then formed straddling each fin stack. Silicon germanium alloy portions that are exposed are oxidized, while silicon germanium alloy portions that are covered by the sacrificial gate structures are not oxidized. A dielectric material having a topmost surface that is coplanar with a topmost surface of each sacrificial gate structure is formed, and thereafter each sacrificial gate structure is removed. Non-oxidized silicon germanium alloy portions are removed suspending silicon portions that were present on each non-oxidized silicon germanium alloy portion. A functional gate structure is then formed around each suspended silicon portion. The oxidized silicon germanium alloy portions remain and provide stress to a channel portion of the suspended silicon portions.

In one aspect of the present application, a semiconductor structure is provided. In one embodiment, the semiconductor structure includes a silicon portion suspended above a topmost surface of an insulator layer. A functional gate structure is positioned around the silicon portion that is suspended above the topmost surface of the insulator layer. A source side non-suspended silicon portion is located on one side of the functional gate structure and is positioned on a surface of an oxidized silicon germanium alloy portion. A drain side non-suspended silicon portion is located on another side of the functional gate structure and is positioned on a surface of another oxidized silicon germanium alloy portion. In accordance with the present application, the oxidized silicon germanium alloy portion and the another oxidized silicon germanium alloy portion introduce a strain into a channel portion of the silicon portion that is suspended above the topmost surface of the insulator layer.

In another aspect of the present application, a method of forming a semiconductor structure is provided. In one embodiment of the present application, the method includes forming a plurality of fin stacks on a surface of a substrate, wherein each fin stack includes a silicon germanium alloy portion and a silicon portion located on a topmost surface of said silicon germanium alloy portion. Next, sacrificial gate structures are formed straddling a portion of each fin stack. Silicon germanium alloy portions of each fin stack that are not protected by the sacrificial gate structures are then oxidized, while silicon germanium alloy portions that are protected by the sacrificial gate structures are not oxidized. A dielectric material having a topmost surface that is coplanar with a topmost surface of each sacrificial gate structure is then formed and thereafter, each sacrificial gate structure is removed to provide a cavity. The non-oxidized silicon germanium portions are then removed thus suspending silicon portions of each fin stack. A functional gate structure is then formed in each cavity.

DETAILED DESCRIPTION

Figure 1:
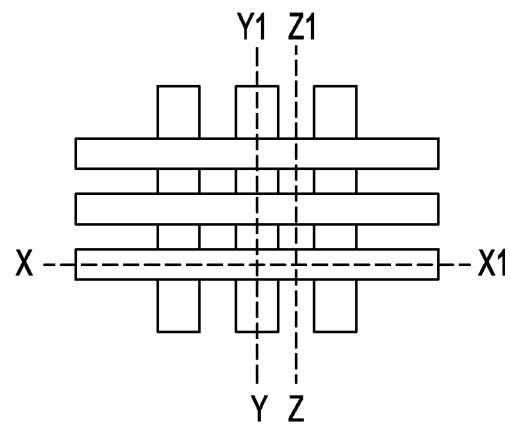
FIG. 1 is a schematic top down view illustrating various cross sectional views that are employed in the drawings of the present application; Cross section X-X1 is along a gate dielectric direction; cross section Y-Y1 is along a fin direction; and cross sectional Z-Z1 is along a direction between adjacent fins.

The present disclosure will now be described in greater detail by referring to the following discussion and drawings that accompany the present disclosure. It is noted that the drawings of the present disclosure are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present disclosure. However, it will be appreciated by one of ordinary skill in the art that the various embodiments of the present disclosure may be practiced without these specific details. In other instances, well-known structures or processing steps have not been described in detail in order to avoid obscuring the present disclosure.

Reference is first made to FIG. 1 which is a schematic top down view illustrating various cross sectional views that are employed throughout the drawings of the present application. This drawing is provided as a key to understand the various drawings that are present in the instant application without the need of producing each cross sectional view during the different processing steps of the present application. In FIG. 1, cross section X-X1 is along a gate dielectric direction; cross section Y-Y1 is along a fin direction; and cross sectional Z-Z1 is along a direction between adjacent fins.

Figure 2:
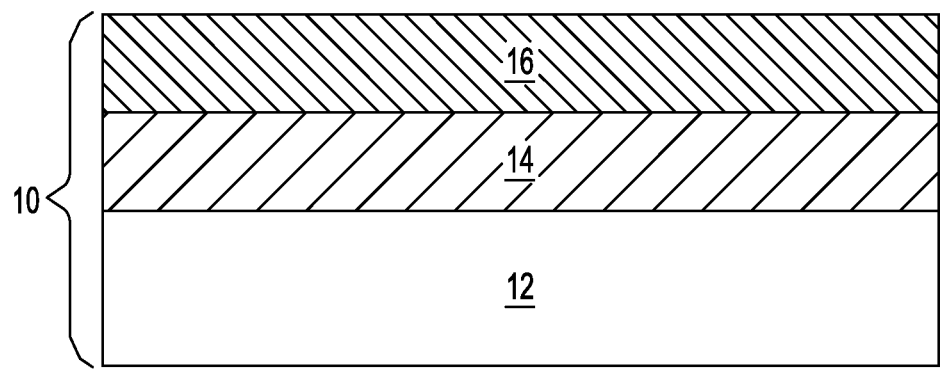
FIG. 2 is a cross sectional view through Y-Y1 of a first exemplary semiconductor structure including, from bottom to top, a handle substrate, an insulator layer and a top semiconductor layer that can be employed in one embodiment of the present application.

Referring now to FIG. 2, there is illustrated a first exemplary semiconductor structure including a semiconductor-on-insulator (SOI) substrate 10 that can be employed in one embodiment of the present application. The SOI substrate 10 includes a handle substrate 12, an insulator layer 14 and a top semiconductor (i.e., SOI) layer 16. In some embodiments of the present application, the handle substrate 12 is optional and the substrate that is employed includes only the insulator layer 14 and the top semiconductor layer 16.

In some embodiments of the present application, the handle substrate 12 of the SOI substrate 10 includes a first semiconductor material which can be selected from, but is not limited to, silicon, germanium, silicon-germanium alloy, silicon carbon alloy, silicon-germanium-carbon alloy, III-V compound semiconductor materials, II-VI compound semiconductor materials, organic semiconductor materials, and other compound semiconductor materials. In some embodiments of the present disclosure, the first semiconductor material of the handle substrate 12 can be a single crystalline, i.e., epitaxial, semiconductor material. The term "single crystalline" as used throughout the present disclosure denotes a material in which the crystal lattice of the entire sample is continuous and unbroken to the edges of the sample, with no grain boundaries. In one example, the handle substrate 12 can be a single crystalline silicon material. In some embodiments, the handle substrate 12 is a non-semiconductor material including, for example, a dielectric material and/or a conductive material.

All or portions of the handle substrate 12 can be doped to provide at least one globally or locally conductive region (not shown) located beneath the interface between the handle substrate 12 and the insulator layer 14. The dopant concentration in doped regions of the handle substrate 12 can be optimized for device performance. The thickness of the handle substrate 12 can be from 50 microns to 1 mm, although lesser and greater thicknesses can also be employed.

The insulator layer 14 of the SOI substrate 10, which is sandwiched between the handle substrate 12 and the top semiconductor layer 16, may be referred to as a buried insulator layer. The insulator layer 14 can be a semiconductor oxide, a semiconductor nitride, a semiconductor oxynitride, or any multilayered stack thereof. In some embodiments, the insulator layer 14 is a silicon oxide layer. In one embodiment, the insulator layer 14 of the SOI substrate 10 can have a thickness from 2 nm to 200 nm, although lesser and greater thicknesses can also be employed.

The top semiconductor layer 16 of the SOI substrate 10 includes a second semiconductor material which is comprised of silicon or a silicon germanium alloy. In some embodiments of the present disclosure, the second semiconductor material of the top semiconductor layer 16 can be a single crystalline, i.e., epitaxial, semiconductor material. In one embodiment, the second semiconductor material of the top semiconductor layer 16 may be comprised of a same semiconductor material as that of the handle substrate 12. In another embodiment, the second semiconductor material of the top semiconductor layer 16 may be comprised of a different semiconductor material as that of the handle substrate 12. In one embodiment, the thickness of the top semiconductor layer 16 can be from 4 nm to 5000 nm, although lesser and greater thickness can also be employed.

In some embodiments in which the top semiconductor layer 16 has a thickness that is outside one of the aforementioned ranges, the top semiconductor layer 16 can be thinned to a desired thickness within one of the above mentioned ranges by planarization, grinding, wet etching, dry etching, oxidation followed by oxide etching, or any combination thereof. One method of thinning the top semiconductor layer 16 is to oxidize the semiconductor material, such as silicon, by a thermal dry or wet oxidation process, and then wet etching the semiconductor oxide layer, such as silicon oxide, using a hydrofluoric (HF) acid mixture. This process can be repeated to achieve the desired thickness of the top semiconductor layer 16.

In some embodiments of the present disclosure, the SOI substrate 10 can be formed by implanting a high-energy dopant such as, for example, oxygen into a bulk semiconductor substrate and then annealing the structure to form the insulator layer 14 of the SOI substrate 10. In another embodiment, the insulator layer 14 may be deposited or grown by thermal techniques prior to the formation of the top semiconductor layer 16. In yet another embodiment, the SOI substrate 10 can be formed using a wafer-bonding technique. Examples of some known processes for fabricating an SOI substrate which can be employed in the present disclosure include Separation by Implanted OXygen (SIMOX) or wafer bonding using SmartCut™.

Figure 3:
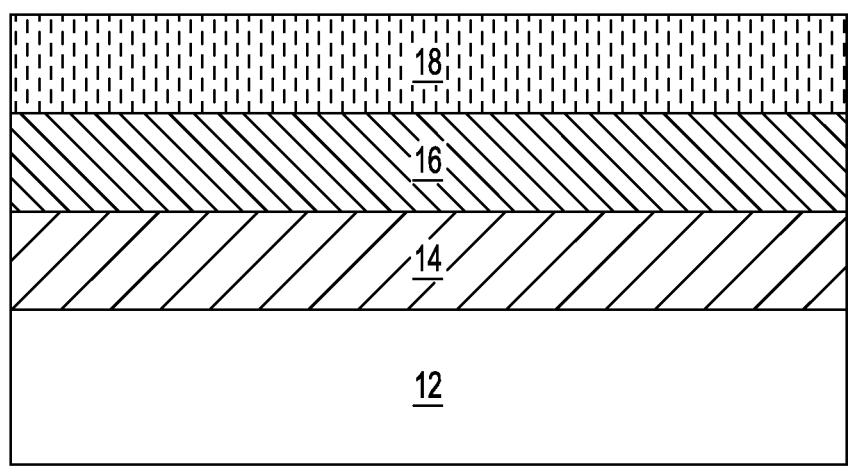
FIG. 3 is a cross sectional view through Y-Y1 of the first exemplary semiconductor structure of FIG. 2 after forming a first silicon germanium alloy layer on an exposed topmost surface of the top semiconductor layer.

Referring now to FIG. 3, there is illustrated the first exemplary semiconductor structure of FIG. 2 after forming a first silicon germanium alloy layer 18 having a first germanium content on an exposed uppermost surface of the top semiconductor layer 16 of the SOI substrate 10 in accordance with an embodiment of the present application. In embodiments in which the top semiconductor layer 16 includes a silicon germanium alloy, the silicon germanium alloy that constituents the top semiconductor layer 16 has a different germanium content than the first silicon germanium alloy layer 18.

In accordance with one embodiment of the present application, the first germanium content of the first silicon germanium alloy layer 18 can be from 5 atomic percent germanium to 70 atomic percent germanium. In accordance with another embodiment of the present application, the first germanium content of the first silicon germanium alloy layer 18 can be from 15 atomic percent germanium to 40 atomic percent germanium.

The first silicon germanium alloy layer 18 can be formed utilizing an epitaxial growth (or deposition) process. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. Thus, in the present application, the first silicon germanium alloy layer 18 has an epitaxial relationship, i.e., same crystal orientation, with the underlying top semiconductor layer 16.

In an epitaxial deposition process, the chemical reactants provided by the source gases are controlled and the system parameters are set so that the depositing atoms arrive at the deposition surface of a semiconductor material with sufficient energy to move around on the surface and orient themselves to the crystal arrangement of the atoms of the deposition surface. Therefore, an epitaxial semiconductor material that is formed by an epitaxial deposition process has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth process apparatuses that are suitable for use in forming the first silicon germanium alloy layer 18 of the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition process for forming the first silicon germanium alloy layer 18 typically ranges from 550° C. to 900° C. Although higher temperature typically results in faster deposition, the faster deposition may result in crystal defects and film cracking.

A number of different source gases may be used for the deposition of the first silicon germanium alloy layer 18. In some embodiments, the source gases for the deposition of the first silicon germanium alloy layer 18 include a silicon containing gas source and a germanium containing gas source. Examples, of silicon containing gas sources include, but are not limited to, silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. Examples of germanium containing gas sources include, but are not limited to, germane, digermane, halogermane, dichlorogermane, trichlorogermane, tetrachlorogermane and combinations thereof. Carrier gases like hydrogen, nitrogen, helium and argon can be used.

The first silicon germanium alloy layer 18 has a thickness from 3 nm to 50 nm. Other thicknesses that are greater than or lesser than the aforementioned thickness range can also be used in the present application.

Figure 4:
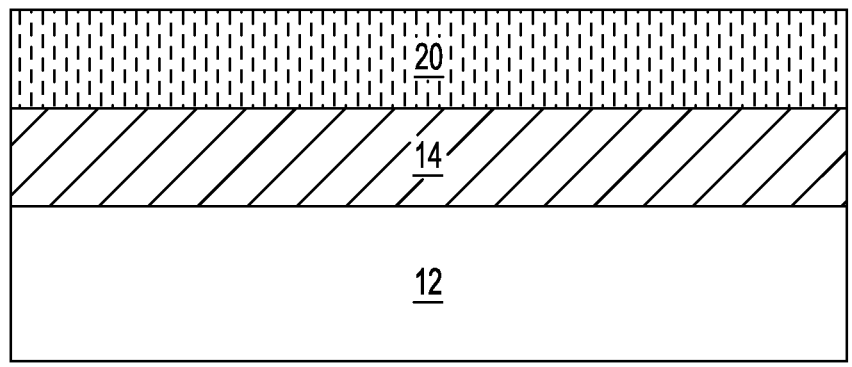
FIG. 4 is a cross sectional view through Y-Y1 of the first exemplary semiconductor structure of FIG. 3 after converting the first silicon germanium alloy layer and the top semiconductor layer into a second silicon germanium alloy layer.

Referring now to FIG. 4, there is illustrated the first exemplary semiconductor structure of FIG. 3 after converting the first silicon germanium alloy layer 18 and the top semiconductor layer 16 into a second silicon germanium alloy layer 20. As is illustrated in FIG. 4, the entirety of the first silicon germanium alloy layer 18 and the entirety of the top semiconductor layer 16 are consumed in providing the second silicon germanium alloy layer 20. As further illustrated in FIG. 4, the second silicon germanium alloy layer 20 has a bottommost surface that directly contacts an uppermost surface of the insulator layer 14 of the SOI substrate 10.

In one embodiment of the present application, an anneal in an oxygen-containing ambient (i.e., thermal condensation) may be used in converting the first silicon germanium alloy layer 18 and the top semiconductor layer 16 into the second silicon germanium alloy layer 20. When such an anneal is performed, the anneal in the oxygen-containing ambient causes germanium to be driven down from the first silicon germanium alloy layer 18 into the top semiconductor layer 16. In accordance with the present application, the anneal in the oxygen-containing ambient is typically performed at a temperature from 900° C. to 1200° C., with a temperature from 950° C. to 1100° C. being more typical. The oxygen-containing ambient that can be used includes any source of oxygen. Examples of suitable sources of oxygen that can be employed during this step of the present application, i.e., during the thermal condensation process, include, but are not limited to, $O_2$, NO, $N_2O$, ozone, air and other like oxygen-containing gases. The oxygen-containing gas may be admixed with each other (such as an admixture of $O_2$ and NO), or the gas may be diluted with an inert gas such as He, Ar, $N_2$, Xe, Kr, or Ne. The duration of the anneal may vary. In one example, the duration of the anneal is from 5 minutes to 15 minutes In another embodiment of the present application, a thermal mixing process may be employed in converting the first silicon germanium alloy layer 18 and the top semiconductor layer 16 into the second silicon germanium alloy layer 20. In accordance with the present application, thermal mixing is typically performed at a temperature from 1000° C. to 1350° C., with a temperature from 1100° C. to 1200° C. being more typical. Thermal mixing may be performed in an inert ambient including, for example, helium, neon, argon and mixtures thereof. In some embodiments of the present application, thermal mixing may be performed using a furnace anneal. In other embodiments of the present application, a rapid thermal anneal can be employed; rapid thermal anneals typically are performed at a higher temperature, but shorter time duration than a furnace anneal.

In some embodiments of the present application, the structure shown in FIG. 4 can be purchased or it can be made by a wafer bonding process, without the need to perform the various processing steps described above in connection with FIGS. 2-4.

Notwithstanding how the structure shown in FIG. 4 was made, the second silicon germanium alloy layer 20 has a second germanium content which can range from 10 atomic percent germanium to 90 atomic percent germanium. The second silicon germanium alloy layer 20 has a thickness from 3 nm to 50 nm. Other thicknesses that are greater than or lesser than the aforementioned thickness range can also be used in the present application.

Figure 5:
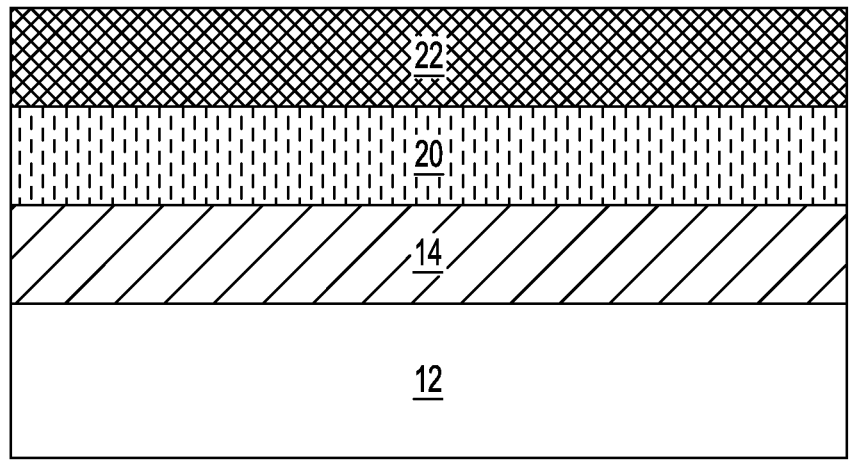
FIG. 5 is a cross sectional view through Y-Y1 of the first exemplary semiconductor structure of FIG. 4 after epitaxially forming a silicon layer on an exposed topmost surface of the second silicon germanium alloy layer.

Referring now to FIG. 5, there is illustrated the first exemplary semiconductor structure of FIG. 4 after epitaxially forming a silicon layer 22 on an exposed topmost surface of the second silicon germanium alloy layer 20. As is illustrated, the silicon layer 22 is a contiguous layer that is formed on an entirety of the exposed topmost surface of the second silicon germanium alloy layer 20.

The silicon layer 22 can be formed utilizing one of the epitaxial growth techniques and apparatuses mentioned above in forming the first silicon germanium alloy layer 18. The temperature for epitaxial deposition process for forming silicon layer 22 typically ranges from 550° C. to 900° C. Since an epitaxial growth process is used in forming the silicon layer 22, silicon layer 22 has an epitaxial relationship with that of the underlying topmost surface of the second silicon germanium alloy layer 20.

A number of different silicon containing source gases may be used for the deposition of the silicon layer 22. Examples include, but are not limited to, silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. Carrier gases like hydrogen, nitrogen, helium and argon can be used.

The silicon layer 22 has a thickness from 3 nm to 50 nm. Other thicknesses that are greater than or lesser than the aforementioned thickness range can also be used in the present application.

The combination of the second silicon germanium alloy layer 20 and the silicon layer 22 provides a single semiconductor material stack structure on the surface of the insulator layer 14. In some embodiments, more than one semiconductor material stack structure including alternating layers of a silicon germanium alloy and silicon can be formed atop the single semiconductor material stack shown in FIG. 5. Such multilayered stack structures can be formed with, or without, breaking a vacuum between the different epitaxial growth processes.

Figure 6A:
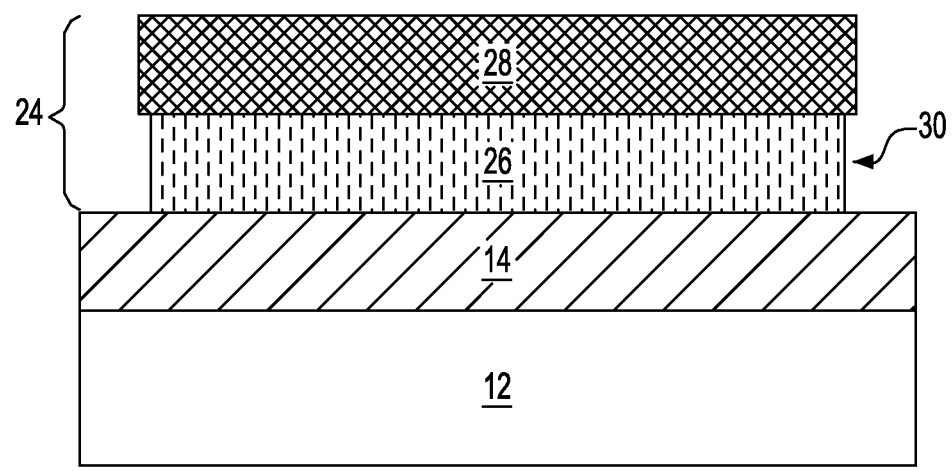
FIG. 6A is a cross sectional view through Y-Y1 of the first exemplary semiconductor structure of FIG. 5 after forming a plurality of fin stacks including, from bottom to top, a silicon germanium alloy portion and a silicon portion.
Figure 6B:
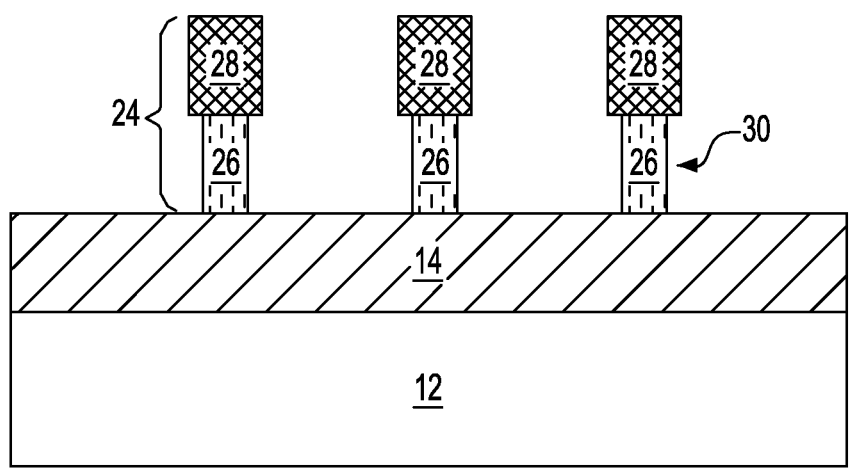
FIG. 6B is a cross sectional view through X-X1 of the first exemplary semiconductor structure of FIG. 5 after forming a plurality of fin stacks including, from bottom to top, a silicon germanium alloy portion and a silicon portion.

Referring now to FIGS. 6A and 6B, there are illustrated the first exemplary semiconductor structure of FIG. 5 after forming a plurality of fin stacks 24. Each fin stack 24 includes a remaining portion of the second silicon germanium alloy layer 20 and a remaining portion of the silicon layer 22. Each remaining portion of the second silicon germanium alloy layer 20 of each fin stack 24 constitutes a silicon germanium alloy portion 26, while each remaining portion of the silicon layer 20 constitutes a silicon portion 28. It is emphasized that in some embodiments each fin stack 24 that is formed may include more than one silicon germanium alloy portion 26 and more than one silicon portion 28 stacked in an alternating manner as described above.

In one embodiment, each fin stack 24 can be formed by lithography and etching. The lithographic step includes applying a photoresist layer (not shown) atop the topmost silicon layer of the semiconductor material stack structure defined above, exposing the photoresist layer to a desired pattern of radiation, and developing the exposed photoresist layer utilizing a conventional resist developer. The etching process comprises dry etching and/or wet chemical etching. Illustrative examples of suitable dry etching processes that can be used in the present disclosure include reactive ion etching (RIE), ion beam etching, plasma etching or laser ablation. Typically, a RIE process or an ion beam etching process is used. The etching process transfers the pattern from the patterned photoresist layer to each semiconductor material (e.g., the Si layer 22 and the second silicon germanium layer 20) of the above defined semiconductor material stack structure utilizing the insulator layer 14 as an etch stop. After transferring the pattern into each semiconductor material (e.g., the Si layer 22 and the second silicon germanium layer 20) of the above defined semiconductor material stack structure), the patterned photoresist layer can be removed utilizing a conventional resist stripping process such as, for example, ashing.

Each fin stack 24 that is formed may have a height ranging from 5 nm to 200 nm, with a height ranging from 10 nm to 100 nm being more typical. Adjacent fin stacks 24 may be separated by a pitch ranging from 20 nm to 100 nm, with a pitch ranging from 30 nm to 50 nm being more typical. As is shown, each silicon germanium alloy portion 26 that remains has a width (i.e., lateral dimension) that is less than a width (i.e., lateral dimension) of each silicon portion 28. This is a result of the second silicon germanium alloy layer 20 being etched laterally during the etch used to define fin stack 24. As such, each silicon germanium alloy portion 26 of the fin stack 24 has sidewalls that are vertically offset (i.e., not vertically aligned) from the sidewalls of each silicon portion 28. Moreover, each silicon germanium alloy portion 26 does not extend beyond the sidewalls of each silicon portion 28. Thus, an undercut 30 is provided beneath each silicon portion 28 of the fin stack 24.

Figure 7:
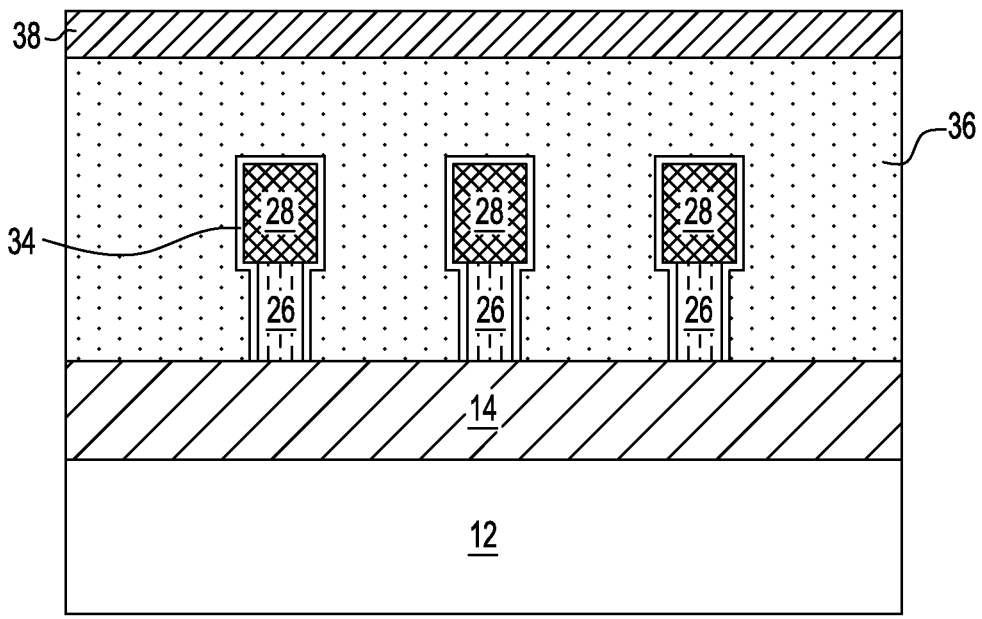
FIG. 7 is a cross sectional view through X-X1 of the first exemplary semiconductor structure of FIGS. 6A-6B after forming a sacrificial gate dielectric and a sacrificial gate material and forming a hard mask layer on an uppermost surface of the sacrificial gate material.

Referring now to FIG. 7, there is illustrated the first exemplary semiconductor structure of FIGS. 6A-6B after forming a sacrificial gate dielectric 34 and a sacrificial gate material 36 around each fin stack 24. A hard mask layer 38 is then formed on an uppermost surface of the sacrificial gate material 36. In some embodiments of the present application, the sacrificial gate dielectric 34 is omitted.

In embodiments in which a sacrificial gate dielectric 34 is present, the sacrificial gate dielectric 34 comes into direct contact with surfaces (sidewalls and topmost) of each fin stack 24 and completely separates the fin stack 24 from the sacrificial gate material 38. In embodiments in which the sacrificial gate dielectric 34 is omitted, the sacrificial gate material 36 comes into direct contact with surfaces (sidewalls and topmost) of each fin stack 24.

When present, the sacrificial gate dielectric 34 can be an oxide, nitride, and/or oxynitride. In one example, the sacrificial gate dielectric 34 can be an oxide such as, for example silicon dioxide. In some embodiments, the sacrificial gate dielectric 34 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, SiN$_x$, a silicate thereof, and an alloy thereof. Each value of x is independently from 0.5 to 3 and each value of y is independently from 0 to 2. In some embodiments, a multilayered sacrificial gate dielectric structure comprising different sacrificial gate dielectric materials, e.g., silicon dioxide, and a high-k gate dielectric can be formed.

When present, the sacrificial gate dielectric 34 can be formed by any deposition technique including, for example, chemical vapor deposition (CVD), plasma enhanced chemical vapor deposition (PECVD), physical vapor deposition (PVD), sputtering, or atomic layer deposition. In some embodiments, a thermal process such as thermal oxidation may be used in forming the sacrificial gate dielectric 34. When thermal processes are used in forming the sacrificial gate dielectric 34, further thinning of each silicon germanium alloy portion 26 may occur.

In one embodiment of the present application, the sacrificial gate dielectric 34 can have a thickness in a range from 1 nm to 10 nm. Other thicknesses that are lesser than or greater than the aforementioned thickness range can also be employed for the sacrificial gate dielectric 34.

Next, a blanket layer of a sacrificial gate material 36 is formed. The blanket layer of sacrificial gate material 36 can be formed, for example, by chemical vapor deposition or plasma enhanced chemical vapor deposition. The thickness of the blanket layer of sacrificial gate material 36 can be from 50 nm to 300 nm, although lesser and greater thicknesses can also be employed. The blanket layer of sacrificial gate material 36 can include any material that can be selectively removed from the structure during a subsequently performed etching process. In one embodiment, the blanket layer of sacrificial gate material 36 may be composed of polysilicon. In another embodiment of the present application, the blanket layer of sacrificial gate material 36 may be composed of a metal such as, for example, Al, W, or Cu. In some embodiments, a planarization process such as, for example, chemical mechanical polishing, may be performed.

After forming the blanket layer of sacrificial gate material 36, the hard mask layer 38 is formed on the topmost surface of the blanket layer of sacrificial gate material 36. The hard mask layer 38 may include a semiconductor oxide, a semiconductor nitride and/or a semiconductor oxynitride. In one embodiment, the hard mask layer 38 can be comprised of silicon dioxide. In another embodiment, the hard mask layer 38 can be comprised of silicon nitride. In yet another embodiment, the hard mask layer 38 can be a stack comprised of, in any order, silicon dioxide and silicon nitride. In some embodiments, the hard mask layer 38 can be formed by a deposition process such as, for example, chemical vapor deposition (CVD) and plasma enhanced chemical vapor deposition (PECVD). In other embodiments, the hard mask layer 38 can be formed by a thermal process such as, for example, thermal oxidation and/or thermal nitridation. In yet other embodiments, the hard mask layer 38 can be formed by a combination of a deposition process and a thermal process. The thickness of the hard mask layer 38 can range from 2 nm to 10 nm, with a thickness from 3 nm to 6 nm being more typical.

Figure 8A:
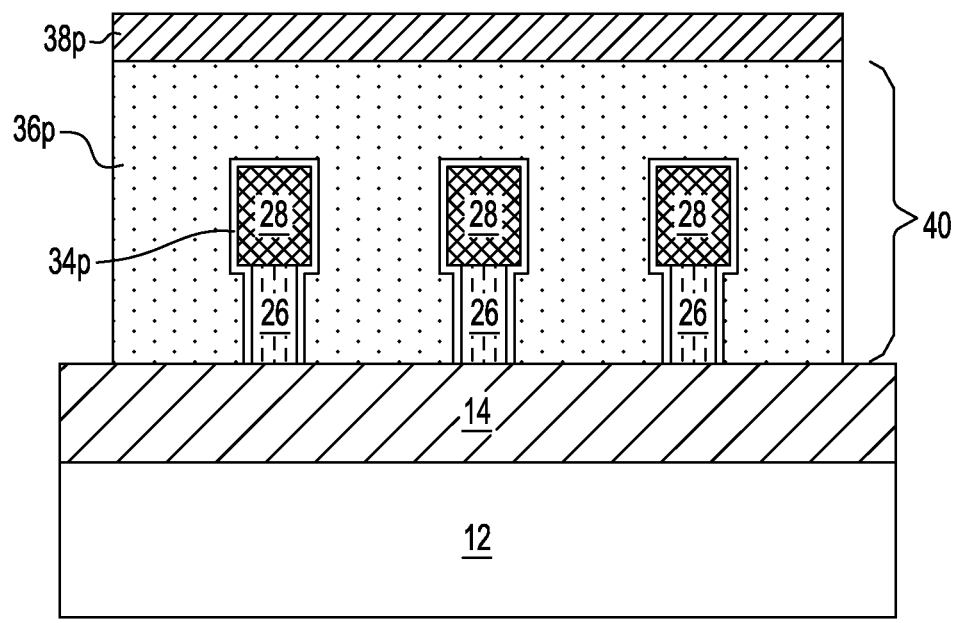
FIG. 8A is a cross sectional view through X-X1 of the first exemplary semiconductor structure of FIG. 7 after patterning the sacrificial gate dielectric, the sacrificial gate material and the hard mask layer to provide a sacrificial gate structure capped with a hard mask layer portion straddling a portion of each fin stack.
Figure 8B:
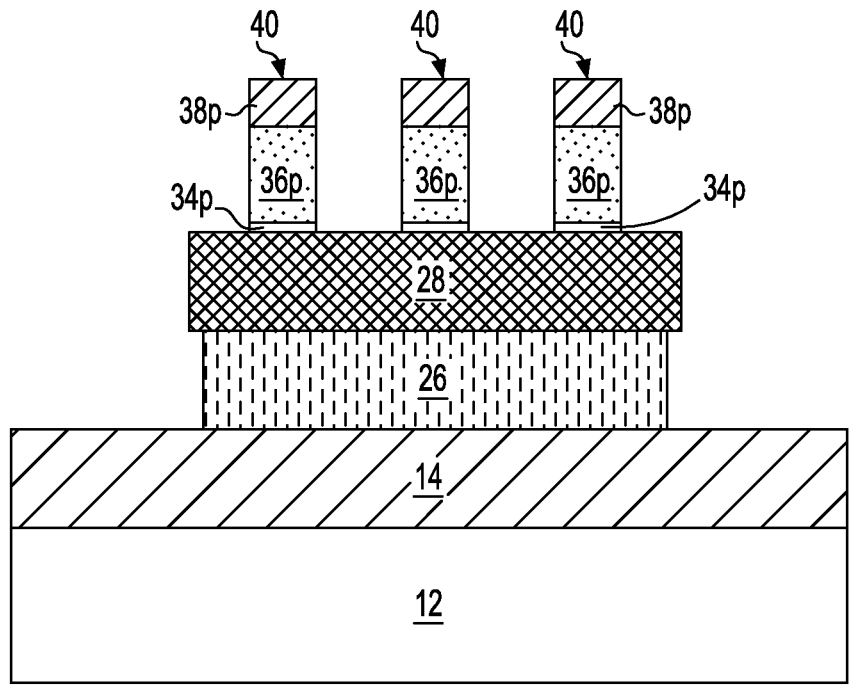
FIG. 8B is a cross sectional view through Y-Y1 of the first exemplary semiconductor structure of FIG. 7 after patterning the sacrificial gate dielectric, the sacrificial gate material and the hard mask layer to provide a sacrificial gate structure capped with a hard mask layer portion straddling a portion of each fin stack.
Figure 8C:
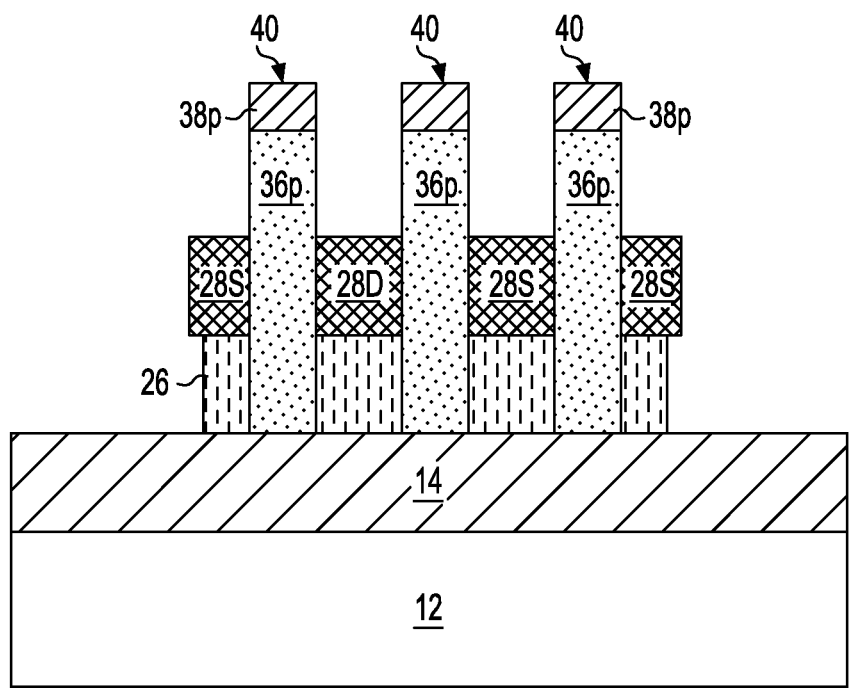
FIG. 8C is a cross sectional view through Z-Z1 of the first exemplary semiconductor structure of FIG. 7 after patterning the sacrificial gate dielectric, the sacrificial gate material and the hard mask layer to provide a plurality of sacrificial gate structure capped with a hard mask layer portion straddling a portion of each fin stack.

Referring now to FIGS. 8A, 8B and 8C, there is shown various views of the first exemplary semiconductor structure of FIG. 7 after patterning the sacrificial gate dielectric 34, the sacrificial gate material 36 and the hard mask layer 38. This patterning step provides a sacrificial gate structure 40 capped with a hard mask layer portion 38$p$ which straddles a portion of each fin stack 24. Each sacrificial gate structure 40 masks the footprint and location where a subsequent functional gate structure will be formed. Each sacrificial gate structure 40 has a bottom surface portion that contacts a topmost surface of the insulator layer 14, and another bottom surface portion that extends atop the topmost silicon portion 28 of each fin stack 24.

The sacrificial gate structure 40 serves as an anchor during the subsequent processing steps of the present application. Additionally, the sacrificial gate structure 40 may be used as a placeholder material for a subsequently provided functional gate structure. The term "functional gate structure" is used throughout the present application as a permanent gate structure used to control output current (i.e., flow of carriers in the channel) of a semiconducting device through electrical or magnetic fields.

Each sacrificial gate structure 40 includes a remaining portion of the sacrificial gate dielectric 34 and a remaining portion of the sacrificial gate material 36. The portion of the sacrificial gate dielectric 34 that remains after patterning is referred to herein as a sacrificial gate dielectric portion 34$p$, while the portion of the sacrificial gate material 36 that remains after patterning is referring to herein as sacrificial a gate material portion 36$p$.

The patterning of the sacrificial gate dielectric 34, sacrificial gate material 36 and the hard mask layer 38 may be performed by lithography and etching. A single etch or multiple etching steps may be employed. In one example, a reactive ion etch can be used in patterning the sacrificial gate dielectric 34, sacrificial gate material 36 and the hard mask layer 38.

After providing the sacrificial gate structures 40, dopant ions (n-type or p-type) can be introduced into exposed portions of the silicon portions 28 by ion implantation, gas phase doping or out-diffusion from a sacrificial material including the dopant species. This process steps introduces dopants into the exposed portions of the silicon portions 28. On one side of the sacrificial gate structure, the now doped silicon portion may be referred to as a source side silicon portion 28S, while on another side of the sacrificial gate structure, the now doped silicon portion may be referred to as a drain side silicon portion 28D. The source side silicon portion 26S is connected to the drain side silicon portion 28D by a silicon portion 28 that is located behind the sacrificial gate structure 40 shown in FIG. 8C of the present application. The silicon portion 28 that is located behind the sacrificial gate structure 40 will be subsequently released forming a suspended silicon portion; the source side silicon portion 28S and the drain side silicon portion are not suspended.

Figure 9A:
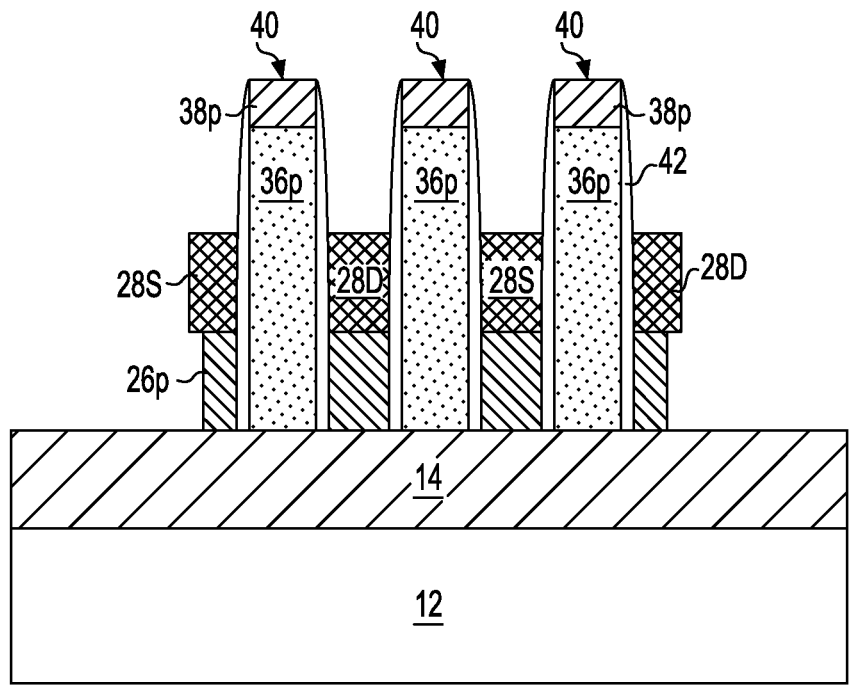
FIG. 9A is a cross sectional view through Z-Z1 of the first exemplary semiconductor structure of FIGS. 8A, 8B and 8C after dielectric spacer formation and oxidation of silicon germanium alloy portions of each fin stack that are not covered by the sacrificial gate structure.
Figure 9B:
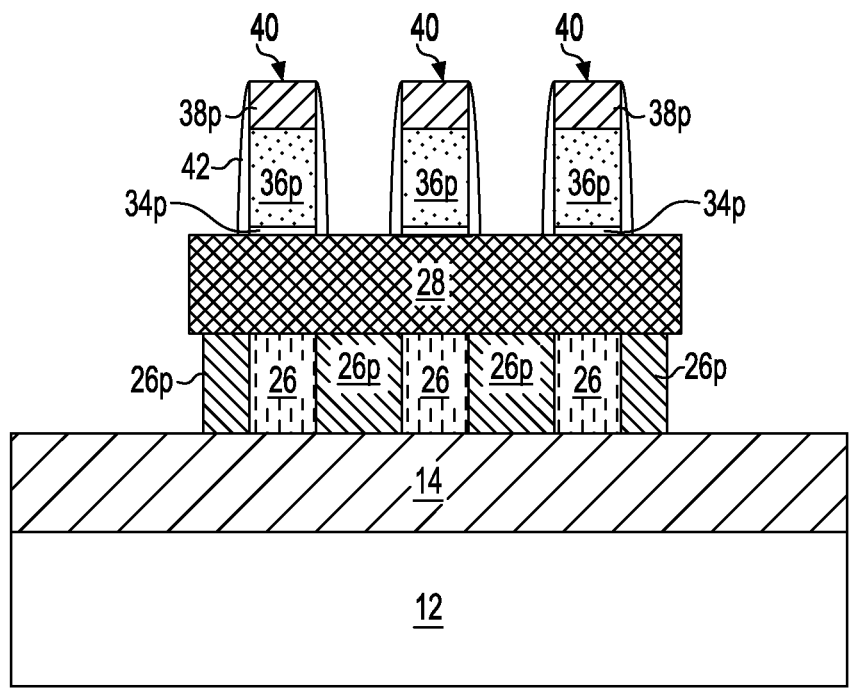
FIG. 9B is a cross sectional view through Y-Y1 of the first exemplary semiconductor structure of FIGS. 8A, 8B and 8C after dielectric spacer formation and oxidation of silicon germanium alloy portions of each fin stack that are not covered by the sacrificial gate structure.

Referring now to FIGS. 9A-9B, there are illustrated the first exemplary semiconductor structure of FIGS. 8A, 8B and 8C after dielectric spacer 42 formation and oxidation of silicon germanium alloy portions 26 of each fin stack 24 that are not covered by the sacrificial gate structure 40; the silicon germanium portions 26 of each fin stack 24 that are protected by the sacrificial gate structure 40 are not oxidized. In the drawings, each oxidized silicon germanium alloy portion of each fin stack 24 is labeled as element 26$p$, while each non-oxidized silicon germanium portion of each fin stack 24 retains the labeling 26. The oxidized silicon germanium alloy portions 26$p$ which consists of elements of Si, Ge and O are used in introducing stress into subsequently formed silicon nanowire portions of the structure. Each non-oxidized silicon germanium portion 26 of each fin stack 24 has a different etch rate than each oxidized silicon germanium alloy portion 26$p$.

The dielectric spacer 42 formation includes deposition of a dielectric spacer material, followed by an etching process such as, for example, RIE. The dielectric spacer material that can be used in providing dielectric spacer 42 includes for example, a dielectric oxide, dielectric nitride, and/or dielectric oxynitride. In one example, the spacer material used in providing the dielectric spacer 42 may be composed of silicon dioxide or silicon nitride. The spacer material can be provided by a deposition process including, for example, chemical vapor deposition (CVD), plasma enhanced chemical vapor deposition (PECVD), or physical vapor deposition (PVD).

The oxidation process that is used in providing the oxidized silicon germanium alloy portions 26p is typically performed at a temperature from 600° C. to 700° C., with a temperature from 625° C. to 675° C. being more typical. The oxidation is performed in an oxygen-containing ambient and at a pressure from 1 atmosphere to 10 atmospheres. The oxygen-containing ambient that can be used includes any source of oxygen. In one embodiment, stream can be used in this step of the present application.

Figure 10:
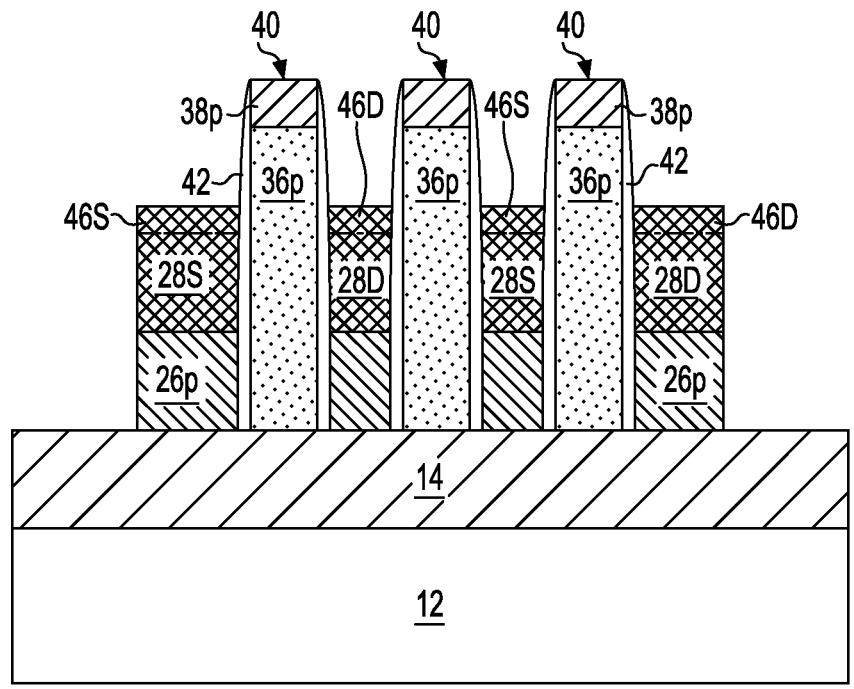
FIG. 10 is a cross sectional view through Z-Z1 of the first exemplary semiconductor structure of FIGS. 9A-9B after formation of raised source regions and raised drain regions.

Referring now to FIG. 10, there is illustrated the first exemplary semiconductor structure of FIGS. 9A-9B after formation of raised source regions 46S and raised drain regions 46D. Each raised source region 46S is formed on an exposed portion of the source side silicon portion 28S and each raised drain region 46D is formed on exposed portions of the drain side silicon portions 28D. Each raised source region 46S and each raised drain region 46D may be formed by an epitaxial growth process such as that described above. In one embodiment, each raised source region 46S and each raised drain region 46D are comprised of silicon. In another embodiment, each raised source region 46S and each raised drain region 46D are comprised of a semiconductor material other than silicon or a silicon germanium alloy. During, or after the epitaxial growth process, dopants (n-type or p-type) can be introduced into the raised source regions 46S and raised drain regions 46D. When the dopants are introduced after the epitaxial growth process, the dopants can be introduced into an intrinsic silicon layer by ion implantation, gas phase doping or out-diffusion from a sacrificial material that includes the dopants.

Figure 11:
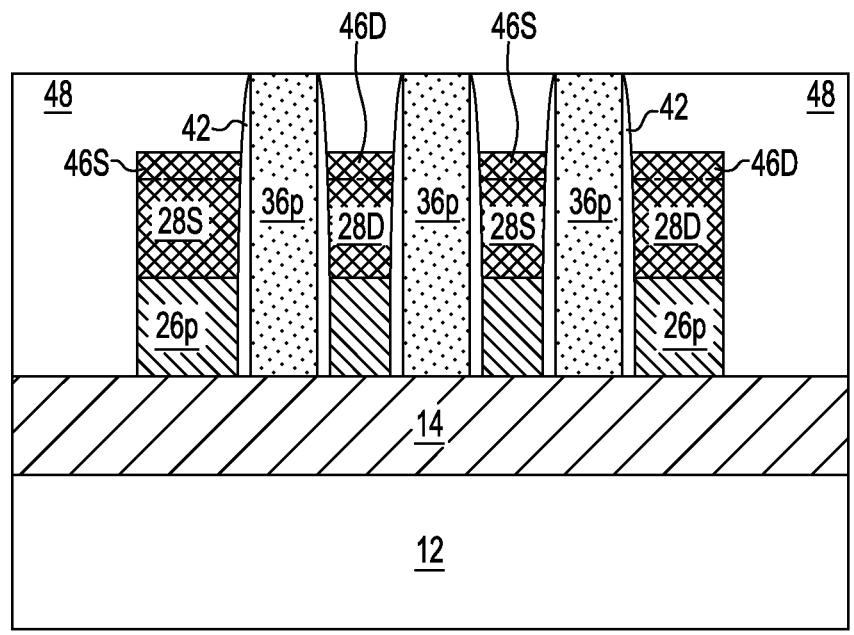
FIG. 11 is a cross sectional view through Z-Z1 of the first exemplary semiconductor structure of FIG. 10 after formation of a dielectric material having a topmost surface that is coplanar with a topmost surface of a sacrificial gate material portion of each sacrificial gate structure.

Referring now to FIG. 11, there is illustrated the first exemplary semiconductor structure of FIG. 10 after formation of a dielectric material 48 having a topmost surface that is coplanar with a topmost surface of the sacrificial gate material portion 36p of each sacrificial gate structure 40. As such, the topmost surface of each sacrificial gate material portion 36p of each sacrificial gate structure 40 is now exposed.

In some embodiments, the dielectric material 48 may be composed of, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as the dielectric material 48.

In one embodiment, the dielectric material 48 can be formed utilizing a deposition process including, for example, chemical vapor deposition (CVD), plasma enhanced chemical vapor deposition (PECVD), evaporation or spin-on coating. Following deposition of the dielectric material 48, a planarization process is employed which removes a portion of the dielectric material 48 and the hard mask portion 38p so as to provide the planar structure shown in FIG. 11. The thickness of the dielectric material 48 that can be employed in the present application may vary depending on the type of dielectric material employed as well as the method that was employed in forming the same. In one embodiment, the dielectric material 48 has a thickness from 80 nm to 500 nm. Other thicknesses that are greater or lesser than the range provided above can also be used for the dielectric material 48.

Figure 12:
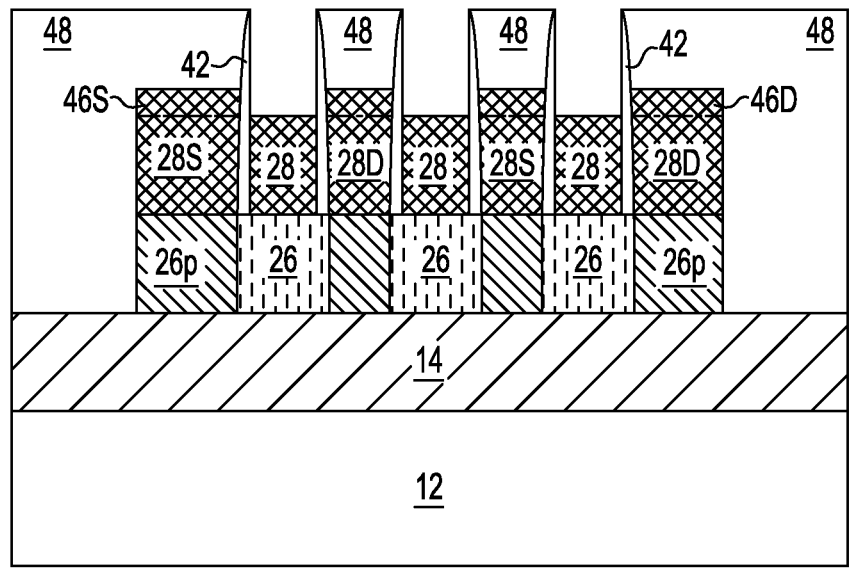
FIG. 12 is a cross sectional view through Z-Z1 of the first exemplary semiconductor structure of FIG. 11 after removing each sacrificial gate structure.

Referring now to FIG. 12, there is illustrated the first exemplary semiconductor structure of FIG. 11 after removing the sacrificial gate material portion 36p and, if present, the underlying sacrificial gate dielectric portion 34p of each sacrificial gate structure 40. As shown, silicon portions 28 that were previously located behind the sacrificial gate structure 40 are now exposed. The removal the sacrificial gate material portion 36p and, if present, the underlying sacrificial gate dielectric portion 34p of each sacrificial gate structure 40 provides a cavity. The sacrificial gate material portion 36p and, if present, the underlying sacrificial gate dielectric portion 34p of each sacrificial gate structure 40 can be removed by etching. In one example, a reactive ion etch can be used to removal each sacrificial gate stack.

Figure 13:
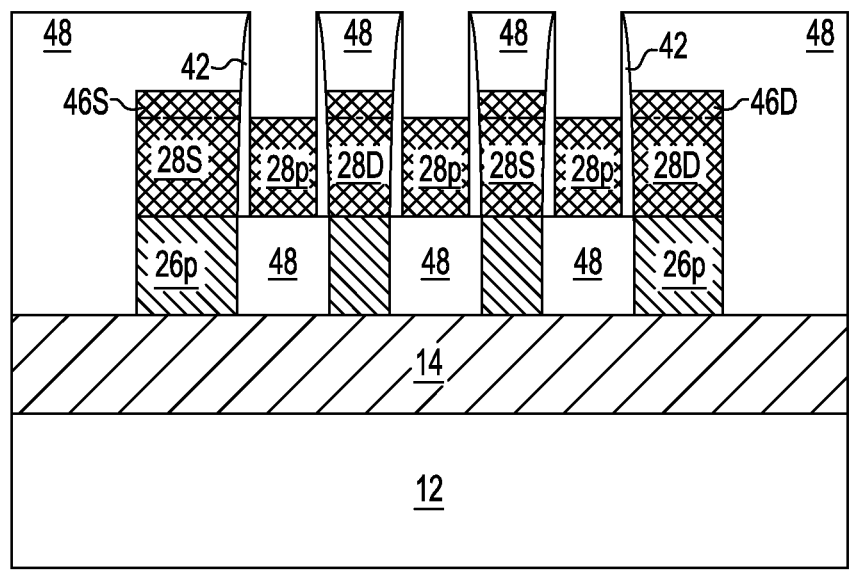
FIG. 13 is a cross sectional view through Y-Y1 of the first exemplary semiconductor structure of FIG. 12 after removing non-oxidized silicon germanium alloy portions of each fin stack and suspending silicon portions of each fin stack.

Referring now to FIG. 13, there is illustrated the first exemplary semiconductor structure of FIG. 12 after removing remaining portions of the non-oxidized silicon germanium alloy layer (i.e., element 26 of each fin stack 24) and suspending remaining portions of the silicon layer (i.e. element 28p) of each fin stack 24. Reference numeral 48 denotes a gap (or space) located between the bottommost surface of the suspended silicon portion 28p and the topmost surface of insulator layer 14. The oxidized silicon germanium portions 26p are not removed during this step of the present application. Each suspended silicon portion 28p provides a nanowire of the inventive device, and the remaining oxidized silicon germanium portions 26p provides stress to a channel region (i.e., a body region) of the suspended silicon portions 28p. The channel region is defined as a portion of the suspended silicon portions 28p in which the functional gate structure, to be subsequently formed, is present thereon.

The removal of the non-oxidized silicon germanium alloy layer 26 of each fin stack 24 can be performed utilizing an etching process that selectively removes non-oxidized silicon germanium alloy compared to silicon. In one example, HCl can be used as the dry gas etchant in a chemical vapor etch system or HCl as a wet etch.

Figure 14:
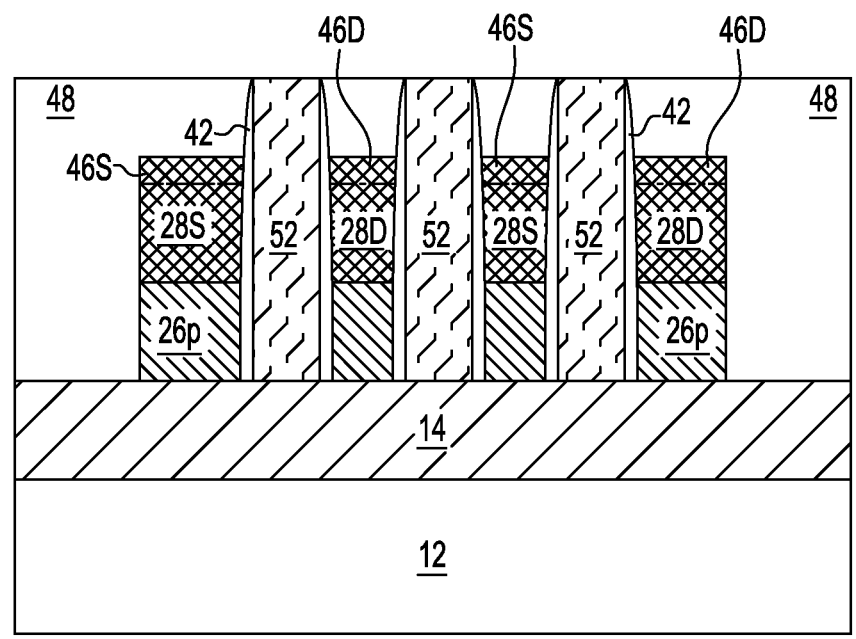
FIG. 14 is a cross sectional view through Z-Z1 of the first exemplary semiconductor structure of FIG. 13 after forming a functional gate structure in a cavity formed during the removal of the sacrificial gate structure.

Referring now to FIG. 14, there is illustrated the first exemplary semiconductor structure of FIG. 13 after forming a functional gate structure. The functional gate structure includes a gate dielectric (not shown in the view provided in FIG. 14) and a gate conductor 52. In the view illustrated, the gate dielectric material will be positioned behind the gate conductor 52 and the gate dielectric material would be located on all surfaces (top, bottom and sidewalls) of the each suspended silicon portion 28p. The functional gate structure wraps around the suspending silicon nanowire (i.e., suspended silicon portion 28p). The gate dielectric that can be used in the present application can be a semiconductor oxide, a semiconductor nitride, and/or a semiconductor oxynitride. In one example, the gate dielectric can be composed of silicon dioxide, silicon nitride and/or silicon oxynitride. In another embodiment of the present application, the gate dielectric may include at least a dielectric metal oxide. Exemplary dielectric metal oxides that can be used as gate dielectric include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a dielectric metal oxide can be formed and used as the gate dielectric.

In some embodiments of the present application, the gate dielectric can be formed by a deposition technique such as, for example, chemical vapor deposition (CVD), plasma enhanced chemical vapor deposition (PECVD), physical vapor deposition (PVD), sputtering, or atomic layer deposition. In one embodiment of the present application, the gate dielectric can have a thickness in a range from 1 nm to 10 nm. Other thicknesses that are lesser than or greater than the aforementioned thickness range can also be employed for the gate dielectric.

The gate conductor 52 that can be used in the present application can be composed of doped polysilicon, doped silicon germanium, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), or multilayered combinations thereof. In one embodiment, an entirety of the gate conductor 52 is comprised of a doped polysilicon or doped polysilicon germanium. In another embodiment, a lower portion of the gate conductor 52 is comprised a conductive material other than doped polysilicon or doped polysilicon germanium, and an upper portion of the gate conductor 16 is comprised of doped polysilicon or doped silicon germanium.

The gate conductor 52 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. In one embodiment, the gate conductor 52 has a thickness from 1 nm to 100 nm. Other thicknesses that are lesser than or greater than the aforementioned thickness range can also be employed for the gate conductor 52.

The structure shown in FIG. 14 illustrates a semiconductor structure in accordance with the present application. The structure includes a suspended silicon portion 28p located above a topmost surface of an insulator layer 14. A functional gate structure (including gate conductor 52) is positioned around the suspended silicon portion 28p. A source side non-suspended silicon portion 28S is located on one side of the functional gate structure and positioned on a surface of an oxidized silicon germanium alloy portion 26p, and a drain side non-suspended silicon portion 28D is located on another side of the functional gate structure and positioned on a surface of another oxidized silicon germanium alloy portion 26p. In accordance with the present application, the oxidized silicon germanium alloy portions introduce a strain into a channel portion of the suspended silicon portion 28p.

It is noted that in the structure shown in FIG. 14 includes a dielectric material 48 surrounding each functional gate structure and a topmost surface of the dielectric material 48 is coplanar with a topmost surface of the functional gate structure. Also, and as illustrated in FIG. 14, each source side non-suspended silicon portion 28S has sidewalls that are vertically coincident to sidewalls of the oxidized silicon germanium alloy portion 26p, and each drain side non-suspended silicon portion 28D has sidewalls that are vertically coincident to sidewalls of other oxidized silicon germanium alloy portions 26p.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure comprising:
   forming a plurality of fin stacks on a surface of a substrate, wherein each fin stack includes a silicon germanium alloy portion and a silicon portion located on a topmost surface of said silicon germanium alloy portion;
   forming sacrificial gate structures straddling a portion of each fin stack;
   oxidizing silicon germanium alloy portions of each fin stack that are not protected by said sacrificial gate structures, wherein silicon germanium alloy portions that are protected by said sacrificial gate structures are not oxidized;
   forming a dielectric material having a topmost surface that is coplanar with a topmost surface of each sacrificial gate structure;
   removing each sacrificial gate structure to provide a cavity;
   removing said non-oxidized silicon germanium portions to suspend silicon portions of each fin stack; and
   forming a functional gate structure in each cavity.

2. The method of claim 1, wherein said forming said plurality of fin stacks on said surface of said substrate comprising:
   providing a silicon-on-insulator substrate comprising, from bottom to top, a handle substrate, an insulator layer and a top semiconductor layer, wherein said top semiconductor layer is selected from silicon or a silicon germanium alloy;
   forming a first silicon germanium alloy layer on an exposed surface of said top semiconductor layer;
   converting said first silicon germanium alloy layer and said top semiconductor layer into a second silicon germanium alloy layer, wherein a bottommost surface of said second silicon germanium alloy layer is in direct physical contact with a topmost surface of said insulator layer;
   forming a silicon layer on a topmost surface of said second silicon germanium alloy layer, wherein said silicon layer has an epitaxial relationship with said second silicon germanium alloy layer; and
   patterning said silicon layer and said second silicon germanium alloy layer by lithography and etching to form said fin stack.

3. The method of claim 2, wherein prior to said patterning at least one material stack comprising, from bottom to top, another second silicon germanium alloy layer and another silicon layer is formed directly on a topmost surface of said silicon layer.

4. The method of claim 2, wherein said converting said first silicon germanium alloy layer and said top semiconductor layer into said second silicon germanium alloy layer comprises a thermal condensation process.

5. The method of claim 4, wherein said thermal condensation process is performed in an oxygen-containing ambient and at a temperature from 900° C. to 1200° C.

6. The method of claim 2, wherein said converting said first silicon germanium alloy layer and said top semiconductor layer into said second silicon germanium alloy layer comprises a thermal mixing process that is performed in an inert ambient and at a temperature from 950° C. to 1100° C.

7. The method of claim 1, wherein said silicon germanium alloy portion has a width that is less than a width of said silicon portion.

8. The method of claim 1, further comprising forming a dielectric spacer on sidewall surfaces of a sacrificial gate material portion of each sacrificial gate structure, wherein said dielectric spacer is formed prior to said forming said dielectric material.

9. The method of claim 1, wherein said oxidizing said silicon germanium alloy portions of each fin stack that are not protected by said sacrificial gate structures is performed in an oxygen-containing ambient.

10. The method of claim 9, wherein said oxidizing is further performed at a temperature from 600° C. to 700° C. and a pressure from 1 atmosphere to 10 atmospheres.

11. The method of claim 1, wherein said removing said non-oxidized silicon germanium portions to suspend said silicon portions of each fin stack comprises an etching process that selectively removed non-oxidized silicon germanium as compared to oxidized silicon germanium.

12. The method of claim 1, wherein said forming said functional gate structure comprising depositing of a gate dielectric and deposition of a gate conductor.

13. The method of claim 1, wherein said silicon germanium alloy portion has an epitaxial relationship with said silicon portion.

14. The method of claim 13, wherein said silicon germanium alloy portion is formed by an epitaxial growth process.

15. The method of claim 13, wherein said silicon germanium alloy portion contains from 10 atomic percent germanium to 90 atomic percent germanium.

16. The method of claim 1, wherein said oxidizing silicon germanium alloy portions provides oxidized silicon germanium alloy portions consisting of elements of Si, Ge and O.

* * * * *